United States Patent [19]  [11] 4,069,474
Boettcher et al.  [45] Jan. 17, 1978

[54] MOS DYNAMIC RANDOM ACCESS MEMORY HAVING AN IMPROVED SENSING CIRCUIT

[75] Inventors: Charles E. Boettcher, Saratoga; Joel A. Karp, Palo Alto; John A. Reed, Los Altos; Andrew G. Varadi, Saratoga, all of Calif.

[73] Assignee: National Semiconductor Corporation, Santa Clara, Calif.

[21] Appl. No.: 677,462

[22] Filed: Apr. 15, 1976

[51] Int. Cl.² .................... G11C 7/06; G11C 11/24; G11C 11/40
[52] U.S. Cl. .................................. 365/205; 307/238; 365/203; 365/208; 365/149
[58] Field of Search .................. 340/173 CA, 173 FF; 307/238, 291

[56] References Cited

U.S. PATENT DOCUMENTS

| | | | |
|---|---|---|---|
| 3,760,381 | 9/1973 | Yao | 340/173 CA |
| 3,838,295 | 9/1974 | Lindell | 340/173 CA |
| 3,992,704 | 11/1976 | Kantz | 340/173 FF |
| 4,004,284 | 1/1977 | Heeren | 340/173 CA |

Primary Examiner—Stuart N. Hecker
Attorney, Agent, or Firm—Gail W. Woodward; Willis E. Higgins

[57] ABSTRACT

In a memory circuit, first and second bit line portions, each having a plurality of memory cells coupled thereto are provided for reading and writing electrical potentials into and out of the coupled memory cells. A bistable flip-flop type sensing amplifier is coupled between the first and second bit portion for sensing the voltage difference therebetween and for latching into one of the two states in response to sensing either a "0" or a "1" accessed to one of the bit line portions from an addressed memory cell to be read out of the memory. A high input impedance amplifier is provided between the respective bit line portion and the respective input terminal of the sensing amplifier for isolating (buffering) the stray capacitance of the sensing amplifier circuit from the capacitance of its bit line. Switchable restore circuitry bypasses each of the isolating line amplifiers for the purposes of restoring electrical potentials read out of the addressed memory cells. In a preferred embodiment, the buffer line amplifiers comprise source follower amplifiers.

5 Claims, 4 Drawing Figures

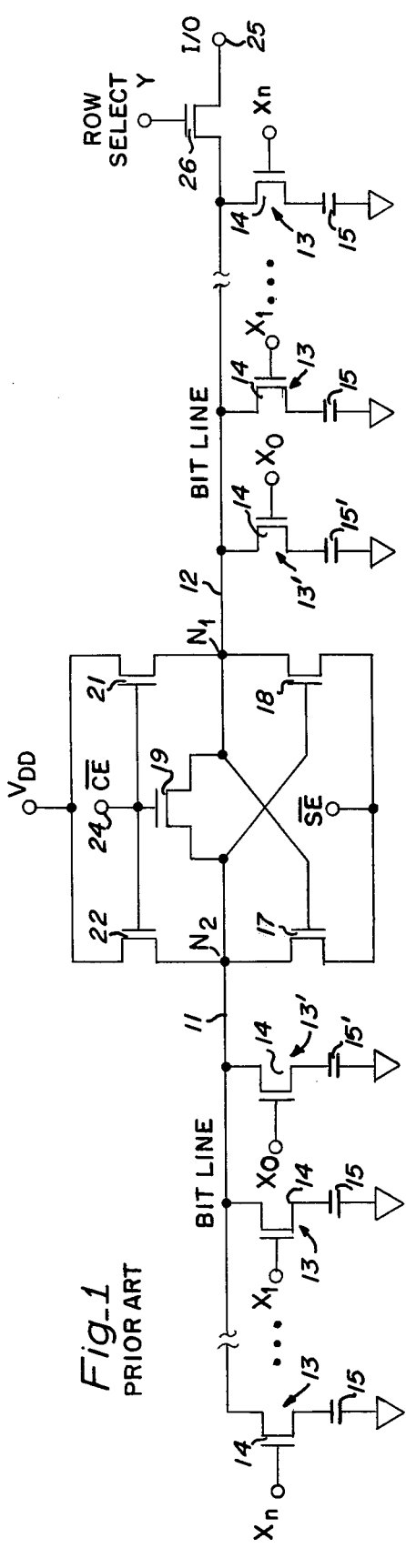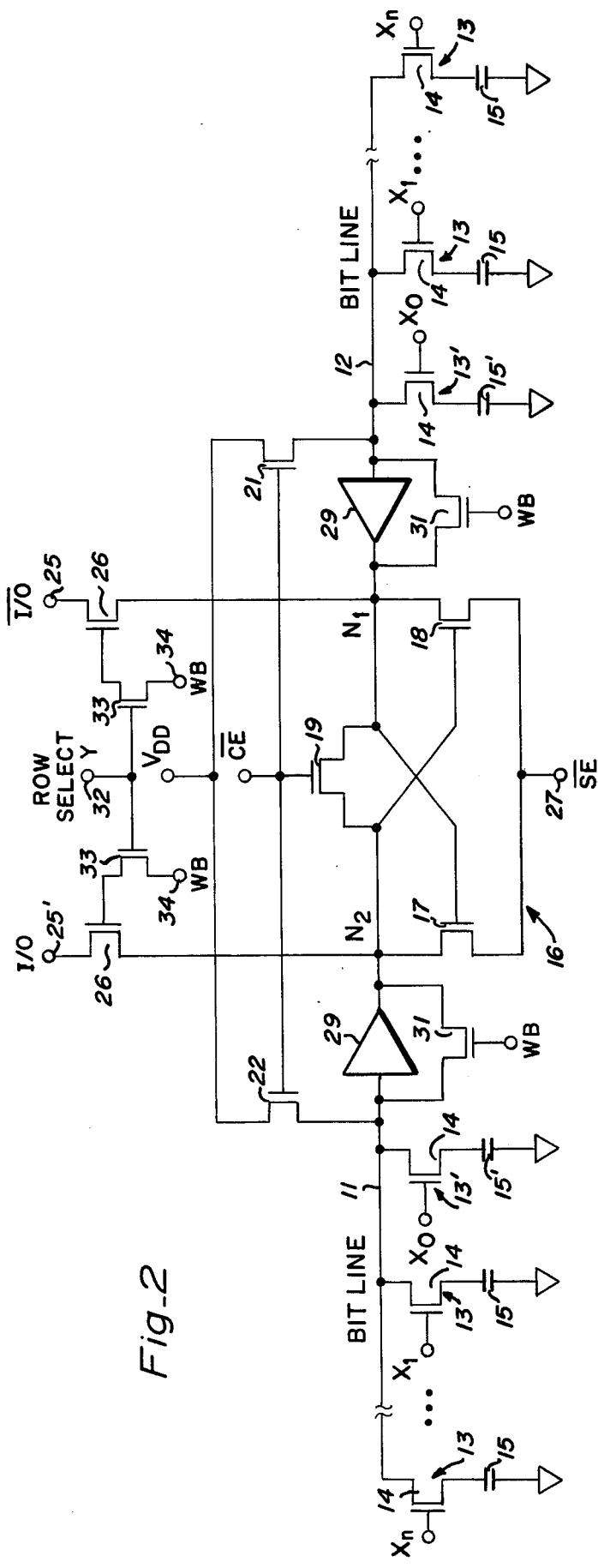
Fig.1 PRIOR ART
Fig.2

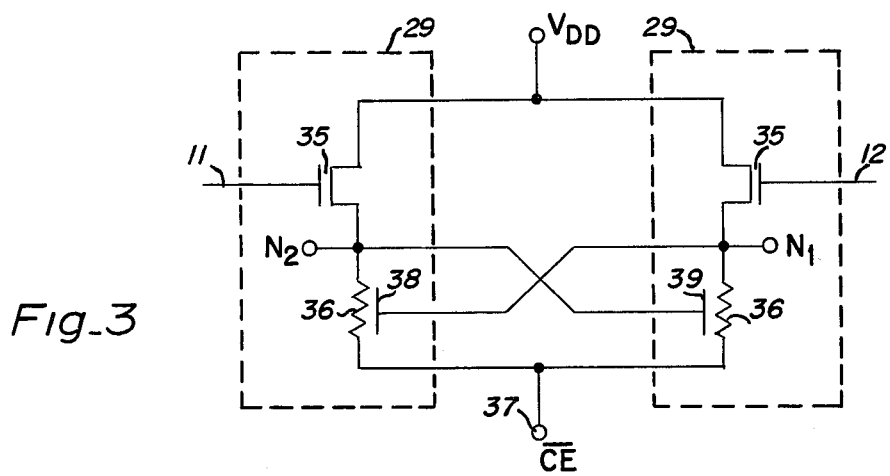
Fig.\_3
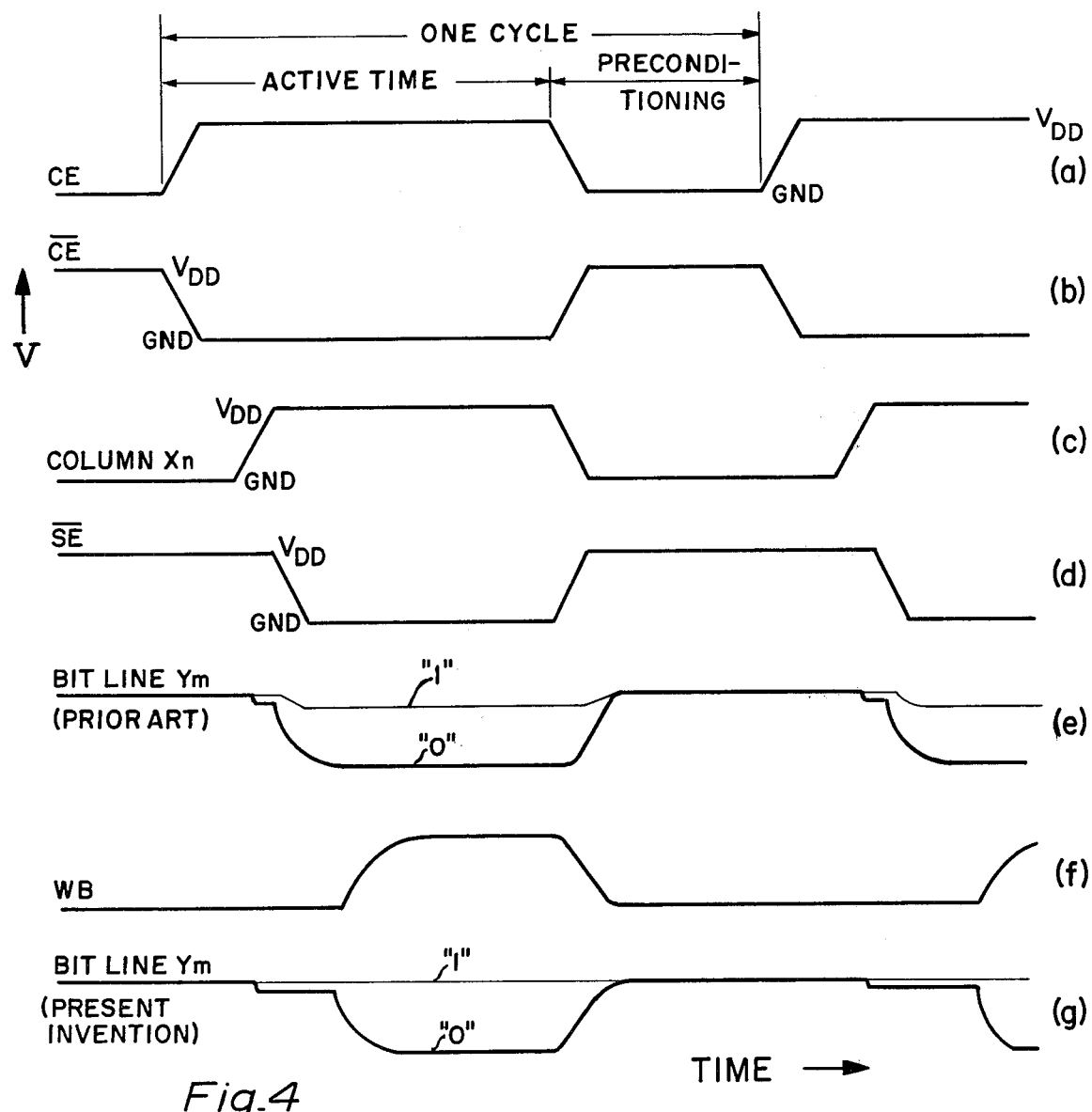
Fig.\_4

MOS DYNAMIC RANDOM ACCESS MEMORY HAVING AN IMPROVED SENSING CIRCUIT

BACKGROUND OF THE INVENTION

The present invention relates in general to MOS dynamic random access memories and more particularly to such memories employing single transistor memory cells selectively coupled onto a bit line for reading out of and writing into an addressed one of the memory cells.

DESCRIPTION OF THE PRIOR ART

Heretofore, MOS dynamic random access memories have employed a matrix of single transistor memory cells with each row or column of the cells being coupled to two halves of a bit line. A flip-flop sensing amplifier has been employed for sensing the voltage difference between the potential on the two halves of the bit line resulting from a sharing of the charge read from a reference cell onto one half of the bit line and sharing of the charge read from an addressed one of the storage cells on the other half of the bit line. The sense amplifier amplifies the slight voltage difference between the two halves of the bit line and latches into one or the other of its stable states in accordance with the sign of the difference signals between the two halves of the bit line. This stable output is determinate of a "1" or "0" read out of the addressed storage cell of the memory and after reading of the charge stored in the addressed cell, the electrical signal is restored to the cell.

A problem with this type of prior art memory is that the parasitic capacitance of the sensing amplifier adds further stray capacitance to the bit line, thereby attenuating the signal to be read from the storage cell due to sharing of the charge drawn from the memory cell and shared thereof between the capacitance of the memory cell and the stray capacitance of the bit line. This condition usually becomes worse when the sensing amplifier is designed to facilitate writing of data into the memory cell because of the increased capacitance of the sensing amplifier in such a case. Furthermore, the bit line adds capacitance to the sense amplifier, thereby slowing down the transition of the sense amplifier to a stable state for readout. The transition of the sense amplifier to a stable state is preferably made as fast as possible for fast readout. However, transient current flowing during the latching phase drains some of the charge from the bit line, thus lowering the charge that is restored on the memory cell.

SUMMARY OF THE PRESENT INVENTION

The principal object of the present invention is the provision of an improved MOS dynamic random access memory.

In one feature of the present invention, buffer amplifiers are provided between the input terminals of the bistable sensing amplifier and the bit line portions so that the capacitance of the sensing amplifier is isolated from the capacitance of the bit line portions. This permits a reduction in the attenuation of the signal to be sensed, allows faster switching in the memory, isolates the sense amplifier from the bit line so that transient currents flowing in the sense amplifier do not partially discharge the bit line, allows writing circuitry to be placed inside the sense amplifier without increasing the stray capacitance of the bit line, and allows electrical balancing of merely the sense amplifier circuitry without having to electrically balance both bit lines.

In another feature of the present invention, the buffer amplifier connected between each of the bit line portions and the respective input terminal of the sense amplifier is of the source following amplifier configuration so as to provide low input capacitance to the corresponding bit line while providing a relatively high degree of isolation between the sense amplifier and the corresponding bit line portion.

Other features and advantages of the present invention will become apparent upon a perusal of the following specification taken in connection with the accompanying drawings wherein:

BRIEF DESCRIPTION OF THE DRAWINGS

FIG. 1 is a schematic circuit diagram for one row of a prior art single transistor memory matrix, FIG. 2 is a schematic circuit diagram, partly in block diagram form, of one row of a single transistor random access memory matrix incorporating features of the present invention, FIG. 3 is a schematic circuit diagram of the bit line buffer amplifiers of FIG. 2, and FIG. 4 is a timing diagram depicting various waveforms found in the circuit of FIG. 2.

DESCRIPTION OF THE PREFERRED EMBODIMENTS

Referring now to FIG. 1 there is shown one row of a prior art dynamic MOS single transistor random access memory matrix. More particularly, the row circuit includes first and second bit line portions 11 and 12 for providing electrical communication to a plurality of individual single transistor memory cells 13 coupled to the bit line portions 11 and 12, respectively.

Each memory cell 13 includes a switching transistor 14 and a storage capacitor 15 for storing electrical potentials representative of "0" or "1". A first one of the storage cells 13' on each bit line portion 11 and 12 which is closest to the center of the two combined bit line portions 11 and 12 has its storage capacitor 15' selected of a certain predetermined capacitance relative to the capacitance of the other memory cell capacitor 15 to act as a reference storage cell. All the other storage cells 13 which are coupled to each of the bit lines 11 and 12 serve for storing information to be stored and read out of the memory matrix. Each of the storage capacitors 15, including the reference capacitors 15' is selectively switched in to electrically conductive relation with the respective bit line portions 11 and 12 via the switching transistors 14. The gates of the switching transistors 14 are connected to column address lines $X_0$, $X_1...X_n$. In a typical example of a 64×64 memory matrix, $n$ is 32 so that there are 32 active memory cells 13 coupled to each bit line portion 11 and 12 in each of 64 rows of the memory matrix.

The inner end of each bit line portion 11 and 12 is connected to a sensing node $N_1$ or $N_2$ forming the pair of input terminals of a bistable sensing amplifier circuit 16. The bistable sensing amplifier 16 comprises a transistorized flip-flop circuit formed by transistors 17 and 18. A transistor switch 19 is connected between the nodes $N_1$ and $N_2$ for equalizing the charge therebetween during precharging of the respective bit line portions 11 and 12. Similarly, transistors 21 and 22 are provided for switching a precharging potential of approximately +12 volts at $V_{DD}$ onto each of the bit line portions 11 and 12. The precharging potential is switched on to each of the bit line portions 11 and 12 via a chip enable signal $\overline{CE}$ applied at terminal 24 which serves to turn on the precharging switching transistors 21 and 22 as well as the equalizing transistor switch 19.

Signals are read into and out of the memory row consisting of bit line portions 11 and 12 via the intermediary of an input/output terminal 25 provided at the end of bit line portion 12 and a row select switching transistor 26 which is series connected between the input output terminal 25 and the outer end of the bit line portion 12. A sense enable signal $\overline{SE}$ is applied to terminal 27 of the sense amplifier 16 for initiating operation and switching of the sense amplifier 16.

In operation, the row of memory cells is preconditioned by charging both bit line portions 11 and 12 to predetermined precharging potential such as $V_{DD}$ by turning on switches 19, 21 and 22. The precharging potential thereby charges the stray capacitance of both bit line portions 11 and 12 to the same potential. After the bit line portions 11 and 12 have been precharged, the precharging switches 19, 21 and 22 are turned off and a selected one of the memory cells 13 is switched onto the respective bit line portion 11 or 12 via energization of one of the column select lines $X_1$-$X_n$. This serves to address the particular memory cell to be read out onto the respective bit line.

Concurrently, one of the reference cells 13' is addressed by the addressing circuit for switching that reference cell which is on the opposite bit line portion, to the cell being read out, onto its respective bit line portion. The reference storage capacitor 15' has previously been precharged to a predetermined level and the capacitance of the reference storage capacitor 15' is chosen relative to the capacitance of the nonreference storage capacitor 15 so that when the reference cell is switched onto the corresponding bit line portion the charge is shared with the bit line capacitance in such a manner that the corresponding bit line establishes a potential approximately midway between that of a "0" and a "1" as produced by a non-reference storage cell 13. When the charge is shared between a nonreference memory cell and the corresponding bit line portion, the bit line portion assumes a potential closer to a "1" or a "0" than that of the reference side of the composite bit line.

The sense amplifier 16 is enabled by applying the sense enable potential $\overline{SE}$ to terminal 27 which turns on the flip-flop sense amplifier 16 and amplifies the small voltage difference appearing between nodes $N_1$ and $N_2$ of the corresponding bit line portions 12 and 11. The flip-flop sense amplifier 16 drives the nodes $N_1$ and $N_2$ to the opposite extreme of the available potential, namely if $N_1$ remains at electrical potential of $V_{DD}$ (an electrical "1"), node $N_2$ will be driven to the potential of an electrical "0" ($\overline{SE}$) or ground potential.

After the sense amplifier 16 has latched into its stable condition, the corresponding "1" or "0" is read out of the bit line by actuation of the row select transistor switch 26 which connects the bit line to the input/output device at terminal 25. The input/output device is coordinated with the column select address so that if a memory cell is addressed on the opposite side of the sense amplifier 16 from the input output terminal 25, the input output signal is converted to its complement to obtain a readout of the signal stored on the addressed memory cell.

One of the problems with the prior art memory circuit of FIG. 1 is that the stray capacitance of the sense amplifier is coupled to each of the bit line portions 11 and 12 so that the effective capacitance of the bit line portions is increased, thereby resulting in an attenuation of the signals to be read out on the respective bit line portions 11 and 12. The situation is complicated even further when it is desired to incorporate a read/write function into the sense amplifier circuit 16. Furthermore, the bit line capacitance adds to the capacitance of the sense amplifier, thereby slowing down the transition of the sense amplifier to one of its stable states for readout. In addition, transient currents flowing during the latching phase of the operating cycle of the sense amplifier produces an unwanted drain of charge from the bit line which is initially at the precharge potential of $V_{DD}$. This lowers the charge on the cell that is restored since when the charge is restored to the addressed memory cell, the read out memory potential is applied to that cell. This lowering of the restored potential applied to the cell is due to the drainage of the bit line portion which is holding an electrical "1" as shown by waveform (e) of FIG. 4.

Referring now to FIG. 2 there is shown a row of memory cells of a memory matrix similar to that of FIG. 1 but incorporating features of the present invention. More particularly, the circuit of FIG. 2 is essentially the same as that of FIG. 1 with the exception that a pair of buffer line amplifiers 29 have been provided between each of the inner ends of the respective bit lines 11 and 12 and the corresponding sense amplifier nodes $N_1$ and $N_2$. In addition, the row select mechanism and the input circuitry has been changed from the end of one of the bit line portions so as to be connected directly to nodes $N_1$ and $N_2$. Furthermore, writeback or restore circuitry has been provided for bypassing the respective buffer line amplifiers 29 for restoring electrical potentials into the respective addressed memory cells 13. Switching transistors 31 are connected for bypassing each of the buffer line amplifiers 29, such switching transistors 31 being turned on by a writeback potential WB applied to the gate of the respective transistors 31. The row select address signal Y is applied to row select input terminal 32 which in turn turns on switching transistors 33 when the writeback potential WB is applied at terminals 34 of the switching transistors 33. When the row select switching transistors 33 are turned on, they serve to turn on input/output switching transistors 26 for connected input/output terminals 25 and 25' to the respective nodes $N_1$ and $N_2$ for inputting and outputting data to the row memory element.

The circuit of FIG. 2 operates in substantially the same manner as that of FIG. 1 with the exception that the buffer line amplifiers 29 serve to isolate the capacitance of the sense amplifier 16 from the capacitance of the bit line portions 11 and 12. In a preferred embodiment, the buffer line amplifiers 29 have a relatively low input capacitance and the preferred configuration for each of the buffer line amplifiers 29 is that of a source follower as shown in FIG. 3. Isolating the capacitance of the sense amplifier circuit 16 from the capacitance of the bit line portions 11 and 12 reduces the attenuation of the signal previously discussed with regard to waveform (e) of FIG. 4 in the operation of the circuit of FIG. 1. In the circuit of FIG. 2, the corresponding waveform is shown by waveform (g) of FIG. 4 which shows that the electrical "1" signal is not substantially degraded by sensing.

Also, isolating the capacitance of the sense amplifier 16 from the capacitance of the bit line allows faster switching of the sense amplifier circuit. Transient currents flowing in the sense amplifier 16 do not partially discharge the precharged bit line. Furthermore, as shown in FIG. 2, the write or restore circuitry can be placed into the sense amplifier circuit without increasing the capacitance of the bit lines 11 and 12. Furthermore, in the circuit of FIG. 2, the circuitry of the sense amplifier 16 need only be balanced, thereby eliminating the requirement for electrically balancing both of the bit line circuits. The result is that the circuit of FIG. 2 provides faster accessing of data and faster writing of data as contrasted with that performance of the circuit of FIG. 1.

The waveforms (a), (b), (c), (d), (f), and (g) of FIG. 4 correspond to the corresponding operating waveforms in the circuit of FIG. 2. After the sense amplifier 16 has latched to its stable state, upon sensing of the voltage difference between bit line portions 11 and 12 as appearing at the output of amplifiers 29 on nodes $N_1$ and $N_2$, the output is read out by enabling the input/output switching transistors 26 via the row select potential Y and the writeback signal WB. Writeback signal WB also actuates writeback bypass switching transistors 31 for writing back the potential on nodes $N_1$ and $N_2$ to the respective bit line portions 12 and 11.

Referring now to FIG. 3 there is shown the circuit for the two source follower buffer line amplifiers 29. More particularly, each amplifier includes a transistor 35 with its source and drain series connected with a resistive load transistor 36 between the source of $V_{DD}$ potential and the complement of the chip enable potential $\overline{CE}$ as applied at terminal 37. The respective output signals, derived across the load transistors 36, appear at nodes $N_1$ and $N_2$. The output signal from node $N_1$ is applied to the gate 38 of the opposite load transistor, whereas the signal developed on node $N_2$ is applied to the gate 39 of the $N_1$ node load transistor 36. This cross-coupling of the gates to the opposite nodes $N_1$ and $N_2$ serves to conserve power by turning off the power in both amplifiers 29 when the sense amplifier 16 latches into the stable state, and WB goes high.

What is claimed is:

1. In a memory circuit:

bit line means having first and second portions over which electrical potentials representative of data to be stored in the memory are sensed and restored;

memory cell means for storing the electrical potentials representative of data to be read out therefrom and restored thereto in use;

switch means for electrically coupling the electrical potentials, representative of the stored and restored data, between said bit line means and said memory cell means in response to address signals applied to said switch means;

sense amplifier means coupled between first and second portions of said bit line means for sensing the difference in electrical potential therebetween generated in response to electrical potential read from one of said addressed memory cell means onto one of said first and second portions of said bit line means; and buffer line amplifier means coupled between said sense amplifier means and said bit line means for isolating capacitance of said sense amplifier means from said bit lines means wherein said buffer line amplifier means includes, transistor means having a gate terminal and first and second other terminals, said gate terminal being connected to one of said bit line portions, and said other first and second terminals being connected for source follower amplifier operation relative to input signals received from said bit line means.

2. The apparatus of claim 1 wherein said sense amplifer means comprises a transistor flip-flop circuit.

3. The apparatus of claim 1 wherein said buffer line amplifier means includes a pair of source follower transistor means one of said source follower transistor means being connected between said sense amplifier means and a respective one of said bit line means portions and wherein the output of each of said source follower transistor amplifier means is coupled into an input of said sense amplifier means for sensing and amplifying the difference in electrical potential between said first and second portions of said bit line means.

4. The apparatus of claim 3 wherein each of said transistor source follower amplifier means includes a resistive load means across which the output signal of said source follower means is developed.

5. The apparatus of claim 4 wherein said resistive load means each comprises a load transistor having a gate terminal and a pair of other terminals, said other terminals being connected in series with said first and second terminals of said source follower transistor means, and said gate terminals of said respective load transistors being connected to the output of said other source follower transistor amplifier means.

* * * * *